(12) United States Patent
Yen

(10) Patent No.: US 9,941,139 B2
(45) Date of Patent: Apr. 10, 2018

(54) METHOD OF SEMICONDUCTOR INTEGRATED CIRCUIT FABRICATION

(71) Applicant: Taiwan Semiconductor Manufacturing Company, Ltd., Hsin-Chu (TW)

(72) Inventor: Yung-Sung Yen, Taipei County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 263 days.

(21) Appl. No.: 14/482,246

(22) Filed: Sep. 10, 2014

(65) Prior Publication Data

US 2016/0071735 A1     Mar. 10, 2016

(51) Int. Cl.
| | |
|---|---|
| *H01L 21/311* | (2006.01) |
| *H01L 21/3213* | (2006.01) |
| *H01L 21/033* | (2006.01) |
| *H01L 21/308* | (2006.01) |

(52) U.S. Cl.
CPC .... *H01L 21/31144* (2013.01); *H01L 21/0337* (2013.01); *H01L 21/3086* (2013.01); *H01L 21/32139* (2013.01)

(58) Field of Classification Search
CPC ........... H01L 21/3081; H01L 21/32139; H01L 21/308; H01L 21/31144; H01L 21/3086; H01L 21/0337
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,791,024 B1 | 7/2014 | Lu et al. | |
| 8,822,243 B2 | 9/2014 | Yan et al. | |
| 2002/0164865 A1* | 11/2002 | Furusawa | H01L 21/31144 438/484 |
| 2003/0119307 A1* | 6/2003 | Bekiaris | H01L 21/0332 438/638 |

(Continued)

FOREIGN PATENT DOCUMENTS

| | | |
|---|---|---|
| KR | 2011-0112728 | 10/2011 |
| KR | 2012-0044071 | 5/2012 |

(Continued)

OTHER PUBLICATIONS

Office Action dated Jan. 15, 2016, issued by the Korean Patent Office in Korean Patent Application No. 10-2014-0193908, 15 pages.

*Primary Examiner* — Bilkis Jahan
(74) *Attorney, Agent, or Firm* — Haynes and Boone, LLP

(57) ABSTRACT

A method of fabricating a semiconductor integrated circuit (IC) is disclosed. In one embodiment, a material layer is formed over a substrate and a first hard mask (HM) feature is formed over the material layer. The HM feature includes an upper portion having a first width and a lower portion having a second width which is greater than the first width. The method also includes forming spacers along sidewalls of the first HM feature, forming second HM features over the material layer by using the spacers as a first etch mask and forming patterned features in the material layer by using the second HM features as a second etch mask.

19 Claims, 9 Drawing Sheets

(56) References Cited

U.S. PATENT DOCUMENTS

| | | |
|---|---|---|
| 2006/0091468 A1 | 5/2006 | Liaw |
| 2007/0048674 A1* | 3/2007 | Wells .................... H01L 27/101 430/313 |
| 2010/0029081 A1* | 2/2010 | Wells .................. H01L 21/0337 438/694 |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

FOREIGN PATENT DOCUMENTS

| | | |
|---|---|---|
| TW | 200830358 | 7/2008 |
| WO | WO-2008-027239 | 6/2008 |

* cited by examiner

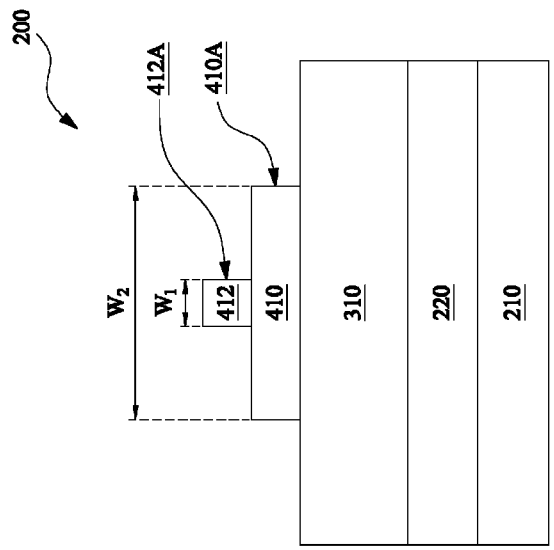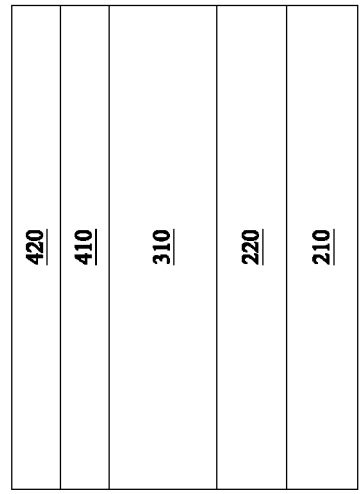
Fig. 2C
Fig. 2B

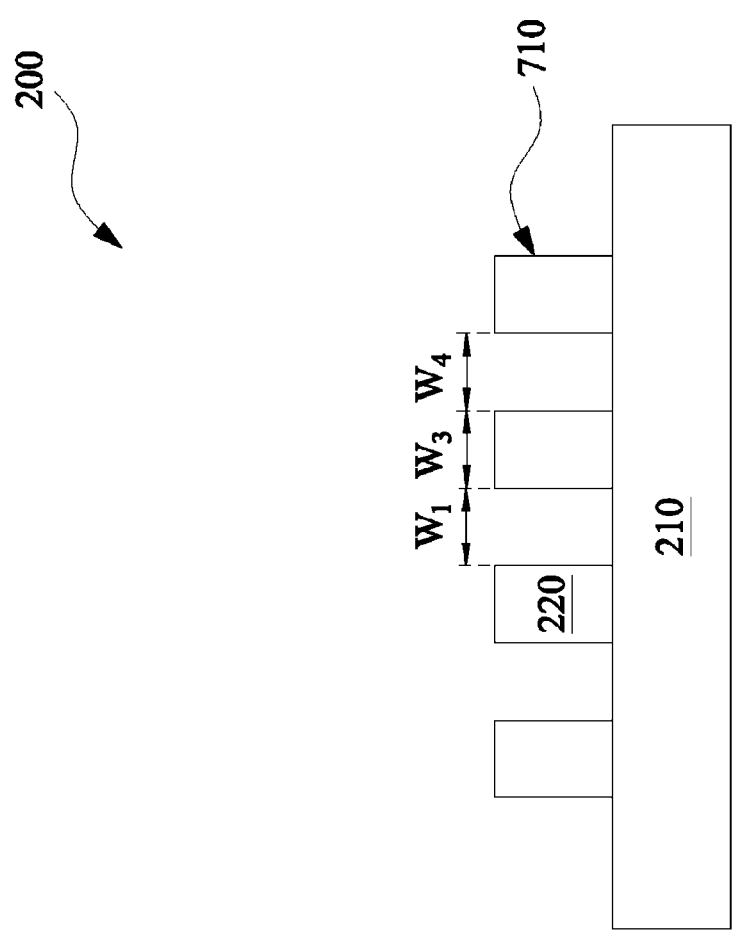

METHOD OF SEMICONDUCTOR INTEGRATED CIRCUIT FABRICATION

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, a feasible method of forming small critical dimension features, such as fins, is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F, 3, 4, 5, and 6 are cross sectional views of an example semiconductor device constructed at fabrication stages in accordance with the method of FIG. 1.

DETAILED DESCRIPTION

Figure 1:
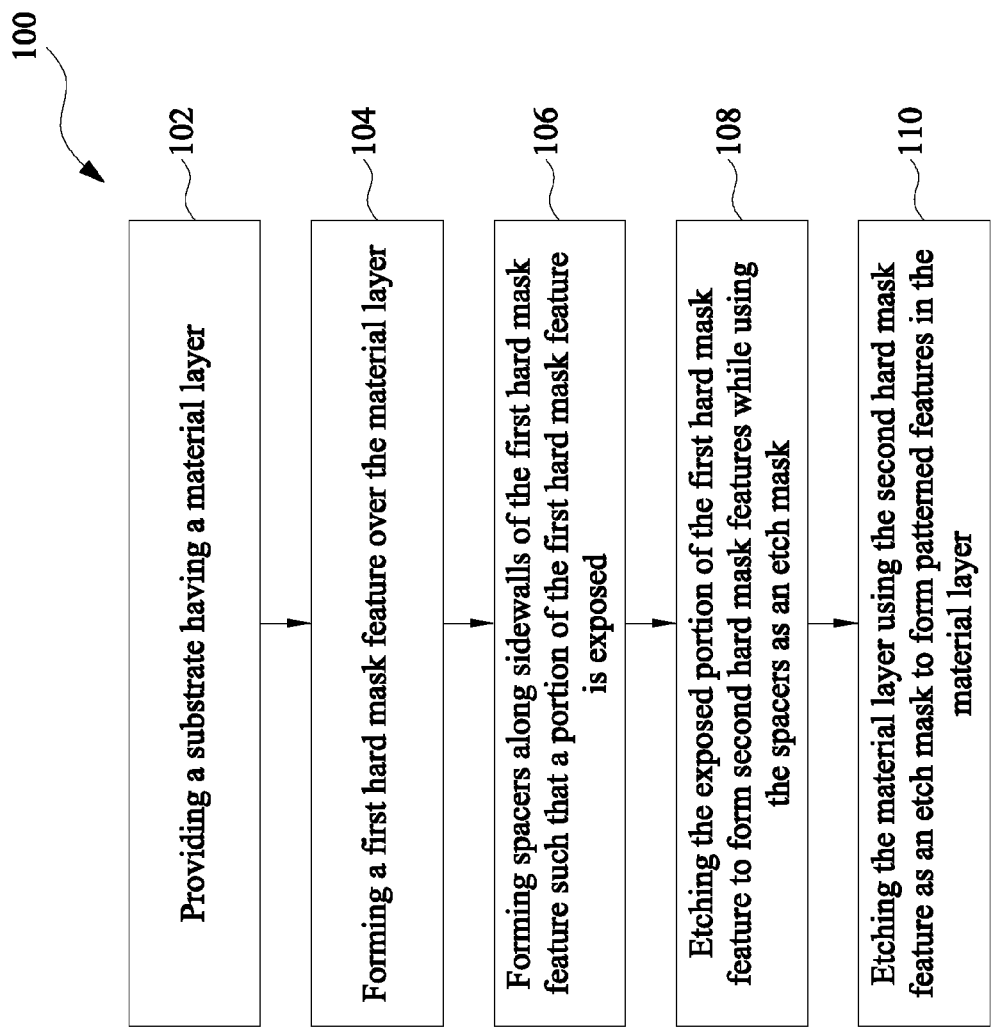
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2A-2F, 3, 4, 5, and 6.

Figure 2A:
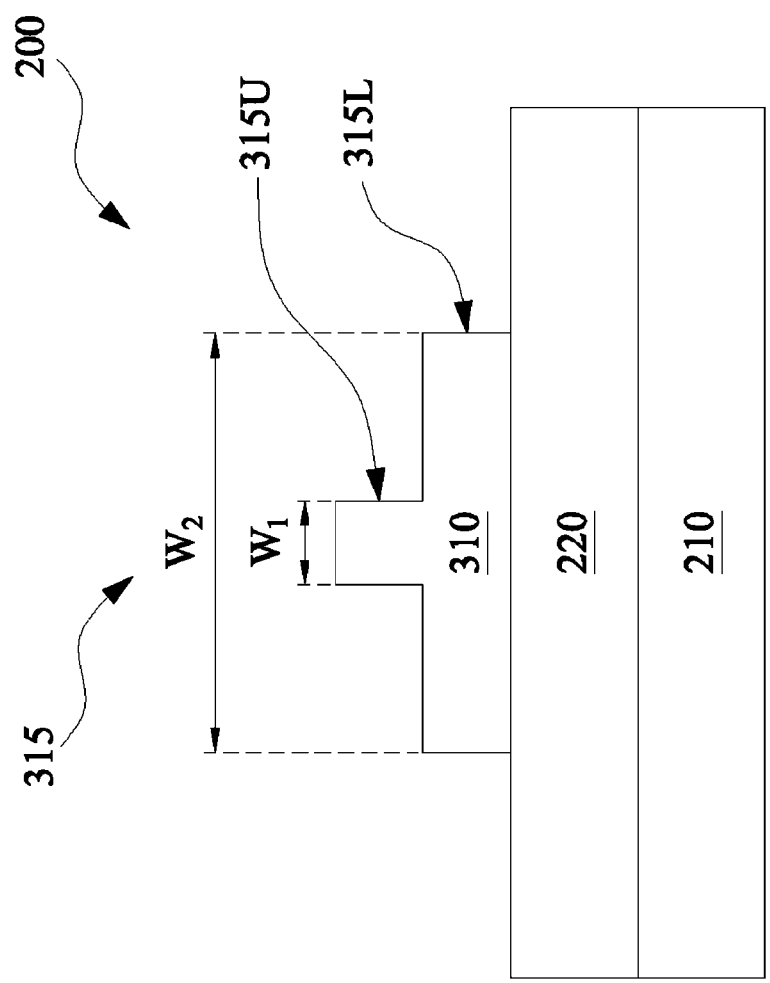

Referring to FIGS. 1 and 2A, the method 100 begins at step 102 by providing a substrate 210 having a material layer 220. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials.

The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials or a combination thereof.

The substrate 210 may also include a plurality of inter-level dielectric (ILD) layers and conductive features integrated to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Still referring to FIG. 2A, in the present embodiment, the material layer 220 is formed over the substrate 210. The material layer 220 may include a semiconductor material layer, a dielectric material layer, a conductive material layer, and/or other suitable material or combination thereof. The material layer 220 may be deposited over the substrate 210 by CVD, PVD, ALD, spin-on coating, and/or other suitable techniques.

Referring also to FIGS. 1 and 2A, the method 100 proceeds to step 104 by forming a first hard mask (HM) feature 315 over the material layer 220. In the present embodiment, the first HM feature 315 includes an upper portion 315U and a lower portion 315L. The upper portion 315U has a first width $w_1$ and the lower portion has a second width $w_2$ which is substantially larger than the first width $w_1$. In one embodiment, the second width $w_2$ is larger than two times of the first width $w_1$. The first HM feature 315 may be formed by suitable processes including deposition, patterning and etch. Some of the exemplary processes to form first HM feature 315 are described below in reference to FIGS. 2B-2F.

FIGS. 2B & 2C describe one exemplary process to form first HM feature 315 shown in FIG. 2A. As shown in FIG. 2B, a HM layer 310 is deposited over the material layer 220. The HM layer 310 may include silicon oxide, silicon nitride, oxynitride, silicon carbide, titanium oxide, titanium nitride, tantalum oxide, tantalum nitride, and/or any suitable materials. The HM layer 310 may be deposited by a suitable technique, such as CVD, PVD, ALD, spin-on coating, and/or other suitable technique.

Next, a first photoresist layer 410 is then formed over the HM layer 310. The first photoresist layer 410 is formed by spin-on coating or other suitable technique. Then a second photoresist layer 412 is formed over the first photoresist layer 410 by spin-on coating or other suitable technique. Other steps, such as baking, may follow the coating of each photoresist layer. The first and second photoresist layers, 410 and 412, may have similar or different compositions from each other, according to various embodiments.

In one example, the first and second photoresist layers, 410 and 412, are chosen to have different exposure thresholds. In another example, the second photoresist layer 412 attenuates an exposing beam during the lithography exposure process such that the exposing beam projected on the second photoresist layer 412 is partially absorbed and only a portion of the exposing beam reaches the first photoresist layer 410. In yet another example, the first and second photoresist layers, 410 and 412, are configured to be exclusively dissolved in separate, respective developers. Specifically, a first developer is used to develop the first photoresist layer 410 and a second developer is used to develop the second photoresist layer 412. The first developer is different from the second developer. The first photoresist layer 410 is dissoluble in the first developer but indissoluble in the second developer. The second photoresist layer 412 is dissoluble in the second developer but indissoluble in the first developer.

In the present embodiment, a single lithography exposure process is then implemented using a photomask to simultaneously expose both of the first and second photoresist layers, 410 and 412, thereby forming latent patterns on respective photoresist layers. During the lithography exposure process, a first latent pattern is formed in the first photoresist layer 410 and a second latent pattern is formed in the second photoresist layer 412. A latent pattern is referred to as a portion of the photoresist layer that is exposed but not developed yet. The first and second latent patterns are different from each other due to different exposing intensities, different exposure thresholds or both.

In the present embodiment, both the first and second photoresist layers are negative tone. The second photoresist layer 412 is then developed by the corresponding developer. The un-exposed portion in the second photoresist layer 412 is removed in the developer, thereby forming a patterned second photoresist layer having the second photoresist feature 412A. The first photoresist layer 410 is then developed by the corresponding developer. The un-exposed portion is removed in the developer, thereby forming a patterned first photoresist layer having the first photoresist feature 410A, as shown in FIG. 2C. The first photoresist feature 410A is formed to have the second width $w_2$ and the second photoresist feature 412A is formed to have the first width $w_1$. As shown in FIG. 2C, $w_2$ is substantially larger than the first $w_1$. The method of forming two patterns simultaneously in two different photoresist layers is described in the patent application U.S. Ser. No. 13/906,795 filed on May 14, 2013, as "Method to define multiple layer patterns using a single exposure", the entire disclosure of which is hereby incorporated by reference.

The HM layer 310 is then etched by using the first and second photoresist features, 410A and 412A as a first etching mask to form the first HM feature 315, as shown in FIG. 2A. The etch process is controlled such that the first photoresist feature 410A is transferred to the HM layer 310 to form the lower portion of the first HM feature 315L and the second photoresist feature 412A is transferred to the HM layer 310 to form the upper portion of the first HM feature 315U. In the present embodiment, the etch process is a selective etch, which does not substantially etch the material layer. Thus, the material layer 220 serves as an etch stop layer, which improves etch process window and profile control. A photoresist strip process is then applied to remove any remaining photoresist layers.

Figure 2E:
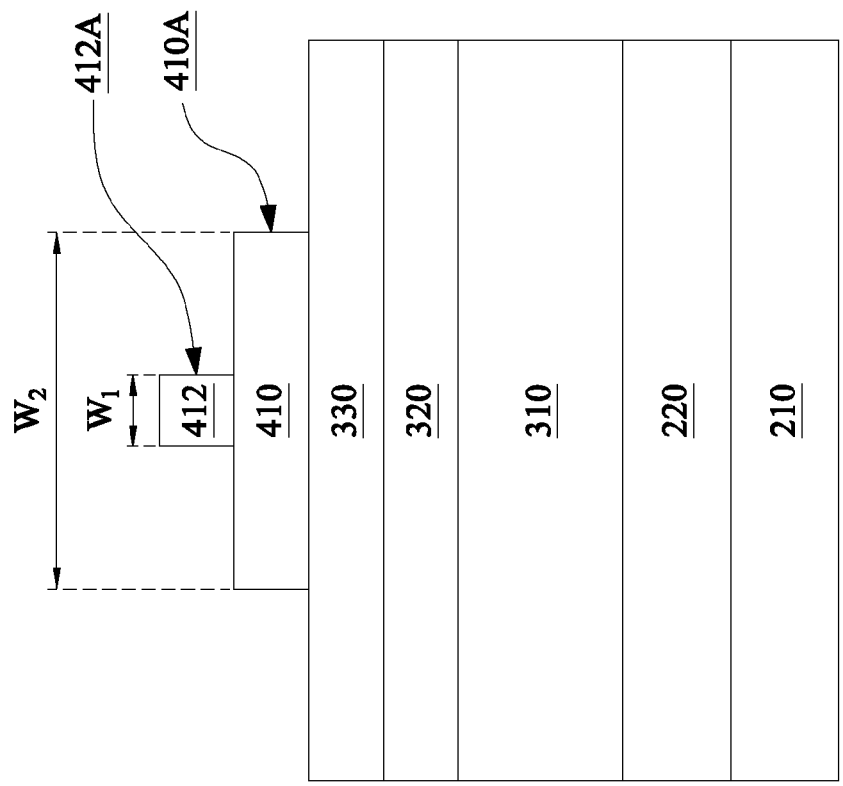
Figure 2D:
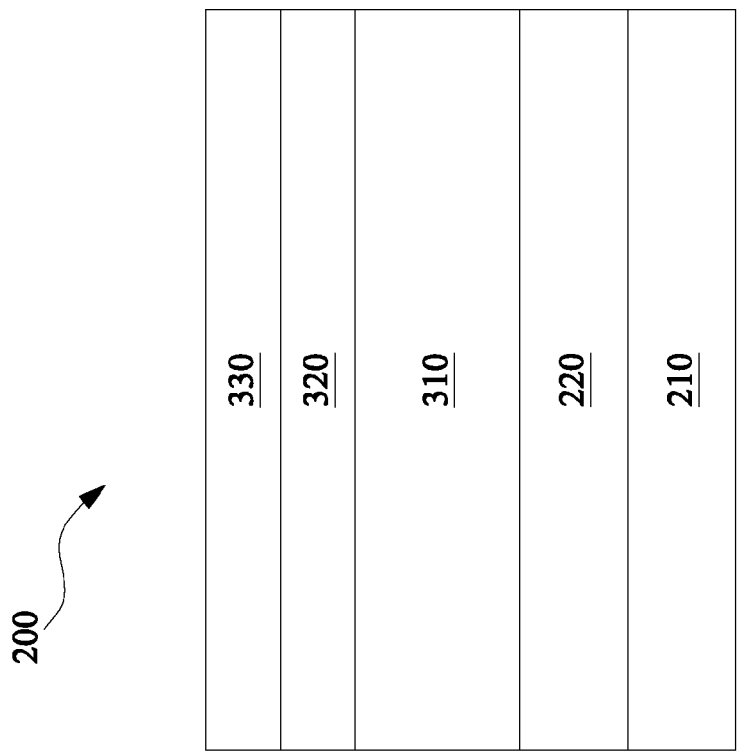
Figure 2F:
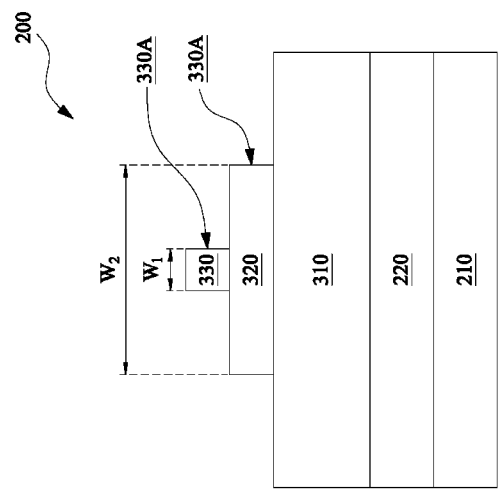

FIGS. 2D-2F illustrate another exemplary process to form first HM feature 315 shown in FIG. 2A. Like reference numerals are used to identify similar features described above with respect to FIGS. 2B and 2C. As shown in FIG. 2D, in this exemplary process to form first HM feature 315, prior to coating the first photoresist layer 410, a stack of interlayers is deposited over the HM layer 310. As an example, the stack of interlayers includes a first interlayer 320 and a second interlayer 330, as shown in FIG. 2D. The first interlayer 320 is formed over the HM layer 310. The first interlayer 320 may include a material which is different from the HM layer 310 to achieve etching selectivity during subsequent etch processes. The first interlayer 320 may include titanium oxide, titanium nitride, tantalum oxide, tantalum nitride, or any suitable materials. The second interlayer 330 is formed over the first interlayer 320. The second interlayer 330 may include a material which is different from the HM layer 310 to achieve etching selectivity during subsequent etch processes. The second interlayer 330 may include a silicon-rich anti-reflection layer. The first and second interlayers, 320 and 330, may be deposited by a suitable technique, such as spin-on coating, CVD, PVD, ALD, or other suitable technique.

The first and second photoresist features, 410A and 412A, are then formed over the second interlayer 330, as shown in FIG. 2D. An etch process is then performed to etch the first and second interlayers, 320 and 330, through the first and second photoresist features, 410A and 412A. The etch process is controlled such that the first photoresist feature 410A is transferred to the first interlayer 320 to form a first interlayer feature 320A and the second photoresist feature 412A is transferred to the second interlayer 330 to form a second interlayer feature 330A, as shown in FIG. 2F. The first interlayer feature 320A carries the second width $w_2$ and the second interlayer feature 330A carries the first width $w_1$. In the present embodiment, the etch process is a selective etch, which does not substantially etch the HM layer 310. Thus, the HM layer 310 serves as an etch stop layer, which improves etch process window and profile control. Then a photoresist strip process is applied to remove any remaining photoresist layers. By employing interlayers, process constrains in lithography patterning are relaxed and etching process window is improved. A photoresist strip process may be applied to remove any remaining photoresist layers.

The HM layer 310 is then etched by using the first and second interlayer features, 320A and 330A as the first etching mask to form the first HM feature 315. The etch process is controlled such that the first interlayer feature 320A is transferred to the lower portion of the first HM feature 315L and the second interlayer feature 330A is transferred to the upper portion of the first HM feature 315U, as shown in FIG. 2A. In the present embodiment, the etch process is a selective etch, which does not substantially etch the material layer 220. Thus, the material layer 220 serves as an etch stop layer, which improves etch process window and profile control. Then another etch process is applied to remove any remaining interlayers.

Referring back to FIG. 2A, in yet another embodiment, the lower portion of the first HM feature 315L is formed first by a first procedure including photoresist coating, patterning and etching. Then the upper portion of the first HM feature 315U is formed next by a second procedure including another photoresist coating, patterning and etching.

In yet another embodiment, the first HM feature 315 is formed by the first photoresist feature 410A as its lower portion 315L and the second photoresist feature 412A as its upper portion 315U.

Figure 3:
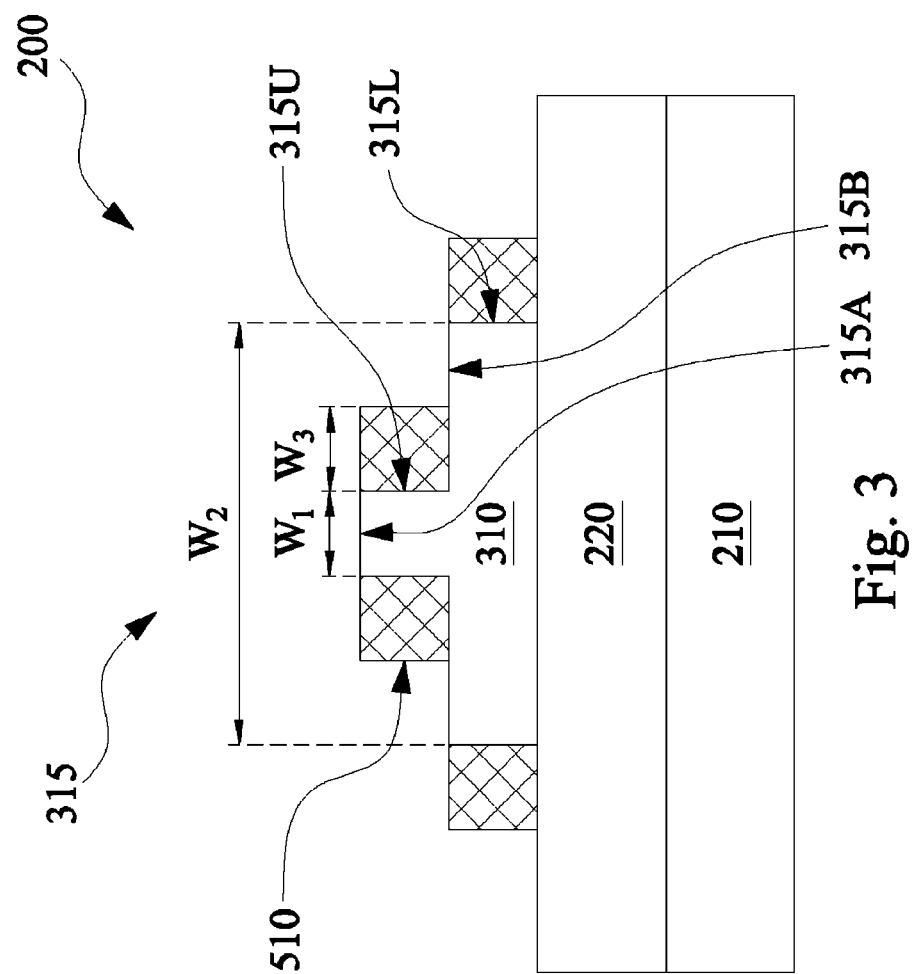

Referring to FIGS. 1 and 3, the method 100 proceeds to step 106 by forming spacers 510 along sidewalls of the first HM feature 315 and exposing a top surface 315A of the HM layer 310 in the upper portion 315U and portions of top surfaces 315B of the HM layer 310 in the lower portion 315L. The spacers 510 may be formed by depositing a spacer layer over the first HM feature 315, and followed by a spacer etch to etch the spacer layer anisotropically. In one embodiment, the spacer etch is controlled to ensure that the top surfaces 315A and 315B are exposed. The spacer layer may include silicon oxide, silicon nitride, oxynitride, silicon carbide, titanium oxide, titanium nitride, tantalum oxide, tantalum nitride, or any suitable materials.

In one embodiment, the spacer layer includes a material which is different from the material layer 220 and the first HM feature 315 to achieve etching selectivity subsequent etches. The spacer layer may be deposited by ALD, CVD, PVD, or other suitable techniques. In one embodiment, the spacer layer is deposited by ALD to achieve conformable film coverage along the sidewalls. By controlling the thickness of the spacer layer and spacer etching process, the spacers 510 are formed to have a third width $w_3$. In one embodiment, the third width $w_3$ is in a range of about 20 nm-60 nm.

Figure 4:
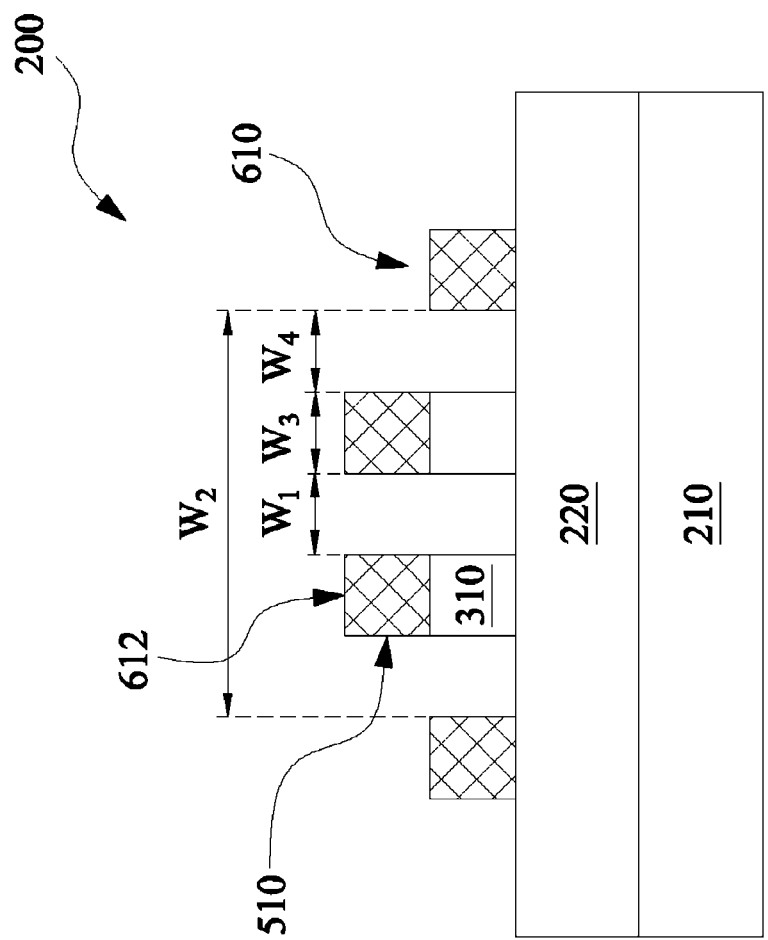

Referring to FIGS. 1 and 4, the method 100 proceeds to step 108 by etching the exposed HM layer 310, using the spacers 510 as an etch mask. The etch process is properly chosen to selectively remove the exposed HM layer 310, but does not substantially etch the spacers 510 and the material layer 220. Thus, the HM layer 310 underneath the spacer 510 remains intact during the etch process. Therefore, spacers 510 on top of the material layer 220 form a first subset of second HM features 610 and spacers 510, combining with the remaining HM layer 310 underneath of it, forms a second subset of the second HM features 612. In the present embodiment, the etch process includes an anisotropic etch. For example, the etch process is a plasma anisotropic etch. Therefore, the first and second subsets of the second HM features, 610 and 612, are formed with vertical profiles. As has been mentioned previously, with an adequate etch selectivity, the material layer 220 serves as an etch stop layer during the etch process, which improves etch process window and trench profile control.

By using spacers 510 as the etch mask, a width of the first and second subsets of the second HM features, 610 and 612, carry the third width $w_3$. A space between two adjacent second subsets of the second HM features 612 is equal to the first width $w_1$, while a space between two adjacent the first subset and the second subset of the second HM feature 610 and the third HM feature 612 is equal to $\frac{1}{2}\{w_2-(2 \times w_3)-w_1\}$, referred to as a fourth width $w_4$. By choosing the first, second and third width, a desired ratio of $w_4$ to $w_1$, as well as $w_4$ to $w_3$, is achieved. In one embodiment, the first, third and fourth widths, $w_1$, $w_3$ and $w_4$ are same to each other.

Figure 5:
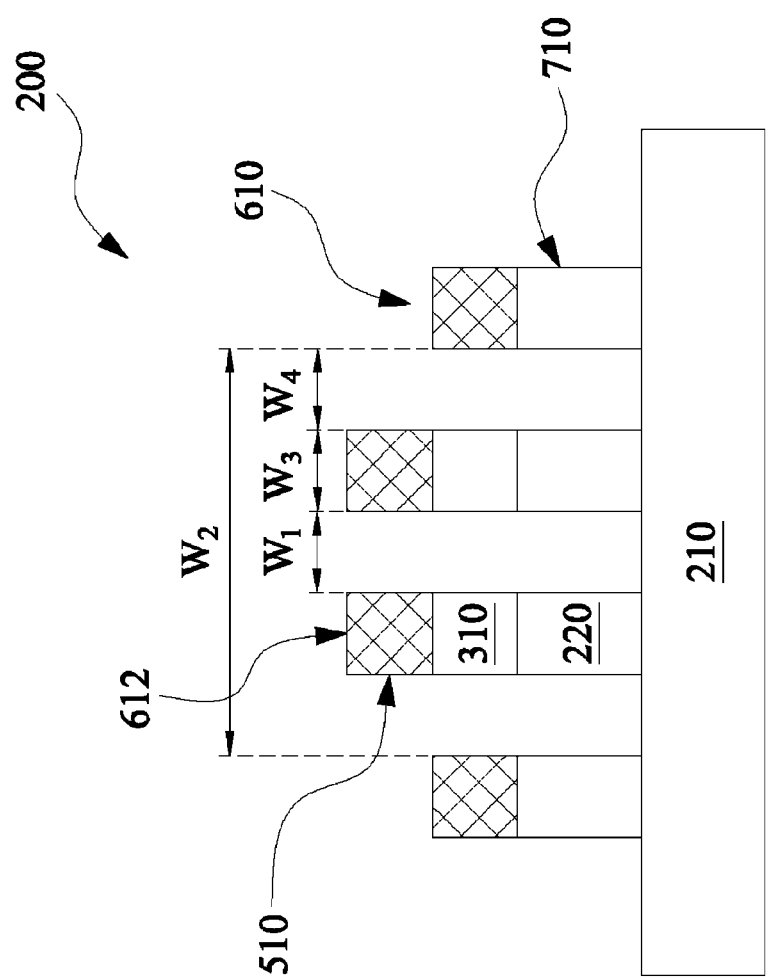

Referring to FIGS. 1 and 5, the method 100 proceeds to step 110 by etching the material layer 220, using the first and second subsets of the second HM features, 610 and 612, as a second etch mask, to form patterned features 710. The etch process is properly chosen to selectively etch the material layer 220, but does not substantially etch the first and second subsets of the second HM features, 610 and 612, and the substrate 210. In the present embodiment, the etch process includes an anisotropic etch, such as a plasma anisotropic etch. Therefore, the patterned features 710 are formed with vertical profiles and carry the third width $w_3$. A space between two adjacent patterned features 710 is either the first width $w_1$ or the fourth width $w_4$. A pitch of the patterned feature 710 is equal to $(w_1+w_3)$ or $(w_1+w_4)$, which is quite small. As has been mentioned previously, with an adequate etch selectivity, the substrate 210 serves as an etch stop layer, which improves etch process window and trench profile control. Then another etch process is applied to remove any remaining second HM feature as shown in FIG. 6.

Additional steps can be provided before, during, and after the method 100, and some of the steps described can be replaced, eliminated, or moved around for additional embodiments of the method 100. The device 200 may undergo further CMOS or MOS technology processing to form various features and regions.

Based on the above, the present disclosure offers methods for fabricating a semiconductor device. The method employs a single lithography patterning and one spacer formation to achieve formation of multiple small pitch features. The method demonstrates process simplification and cost reduction.

The present disclosure provides many different embodiments of fabricating an IC that provide one or more improvements over other existing approaches. In one embodiment, a method includes forming a material layer over a substrate, forming a first hard mask (HM) feature over the material layer. The HM feature includes an upper portion having a first width and a lower portion having a second width which is greater than the first width. The method also includes forming spacers along sidewalls of the first HM feature, forming second HM features over the material layer by using the spacers as a first etch mask and forming patterned features in the material layer by using the second HM features as a second etch mask.

In another embodiment, a method for fabricating a semiconductor device includes forming a material layer over a substrate, forming a first hard mask (HM) feature over the material layer. The first HM feature includes an upper portion with a first width and a lower portion with a second width, which is substantially larger than the first width. The method also includes forming spacers along sidewalls of the first HM feature. It leave portions of top surfaces of the HM layer, which are not covered by the spacer, be exposed. The method also includes removing the exposed HM layer to form second HM feature over the material layer, using the first HM feature as etch masks and etching the material layer to form patterned features over the substrate, using the second HM feature as etch masks.

In yet another embodiment, a method for fabricating a semiconductor IC includes forming a material layer over a substrate, forming a hard mask (HM) layer over the material layer, forming a first photoresist (PR) layer over the HM layer, forming a second PR layer over the first PR Layer, forming a first PR feature in the second PR layer and a PR feature in the first PR layer by performing a single exposure process. Thus the first PR feature aligns to the second PR feature by center to center. A width of the first PR feature is substantial smaller than a width of the second PR feature. The method also includes etching the HM layer through the first and second PR features to form a first HM feature, such that the first PR feature is transferred to an upper portion of the first HM feature and the second PR feature is transferred to a lower portion of the first HM feature. The method also includes forming spacers along the first HM features, wherein it leave portions of top surfaces of the HM layer, which are not covered by the spacer, be exposed. The method also includes removing the exposed HM layer to form second HM feature over the material layer and etching the material layer to form patterned features over the substrate, using the second HM feature as etch masks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, the method comprising:
    forming a material layer over a substrate;
    forming a first hard mask (HM) feature over the material layer, the first HM feature including an upper portion having a first width and a lower portion having a second width which is greater than the first width, wherein the forming of the first HM feature includes:
        depositing a HM layer over the material layer;
        forming a photoresist feature over the HM layer, wherein the photoresist feature includes an upper portion having the first width and a lower portion having the second width; and
        transferring a shape of the photoresist feature to the HM layer, thereby forming the first HM feature;
    forming spacers along sidewalls of the first HM feature;
    forming second HM features over the material layer by etching the first HM feature using the spacers as a first etch mask; and
    forming patterned features in the material layer by using at least the spacers as a second etch mask.

2. The method of claim 1, wherein the forming of the photoresist feature includes:
    coating a first photoresist layer over the HM layer;
    coating a second photoresist layer over the first photoresist layer; and
    patterning the first and second photoresist layers to form the upper portion of the photoresist feature in the second photoresist layer and the lower portion of the photoresist feature in the first photoresist layer.

3. The method of claim 2, wherein the patterning of the first and second photoresist layers includes:
    performing a single exposure process to the first and second photoresist layers to form a first latent feature and a second latent feature in the first and second photoresist layers, respectively; and
    performing a development process to form the upper portion and lower portion of the photoresist feature by removing the second and first latent features, respectively.

4. The method of claim 1, wherein the transferring of the shape of the photoresist feature to the HM layer includes:
    etching the HM layer through the photoresist feature, wherein the etching does not substantially etch the material layer; and
    removing remaining photoresist layers.

5. The method of claim 1, wherein the transferring of the shape of the photoresist feature to the HM layer includes:
    applying a first patterning and a first etch to the HM layer to form the lower portion of the first HM feature; and
    applying a second patterning and a second etch to the HM layer to form the upper portion of the first HM feature.

6. The method of claim 1, wherein the forming of the first HM feature further includes:
    depositing a first interlayer over the HM layer;
    depositing a second interlayer over the first interlayer;

forming the photoresist feature over the second interlayer;
using the upper portion of the photoresist feature to pattern the second interlayer and the lower portion of the photoresist feature to pattern the first interlayer; and
transferring the patterned first interlayer to the HM layer as the lower portion of the first HM feature and transferring the patterned second interlayer to the HM layer as the upper portion of the first HM feature.

7. The method of claim 1, wherein the forming of the second HM features includes:
exposing portions of the first HM feature during the forming of the spacers; and
etching the portions of the first HM feature using the spacers as etch masks, wherein the etching does not substantially etch the spacers and the material layer.

8. The method of claim 1, wherein both the lower and upper portions of the first HM feature are formed with a substantially vertical profile.

9. The method of claim 1, wherein the second HM features are formed with substantially vertical profiles and have a width which is substantially same as a width of the spacers.

10. The method of claim 1, wherein the patterned features are formed with a width which is substantially same as a width of the spacers.

11. The method of claim 1, further comprising:
depositing a first interlayer over the HM layer; and
depositing a second interlayer over the first interlayer, wherein the photoresist feature is formed over the second interlayer,
wherein the etching of the HM layer includes:
transferring the upper portion of the photoresist feature to the second interlayer and the lower portion of the photoresist feature to the first interlayer; and
etching the HM layer through the second interlayer and the first interlayer after the transferring.

12. The method of claim 1, wherein the spacers have a third width that is about the same as the first width.

13. A method for fabricating a semiconductor device, the method comprising:
forming a material layer over a substrate;
forming a first hard mask (HM) feature over the material layer, from a cross-sectional view, the first HM feature exposing a top surface of the material layer and including: an upper portion with a first width; and a lower portion with a second width, which is larger than the first width, wherein the upper portion and the lower portion are formed of the same material, wherein the forming of the first HM feature includes:
depositing a HM layer over the material layer,
forming a photoresist feature over the HM layer, wherein the photoresist feature includes an upper portion having the first width and a lower portion having the second width, and
transferring the photoresist feature to the HM layer;
forming spacers along sidewalls of the first HM feature, wherein first portions of the first HM feature are exposed;
removing the first portions of the first HM feature to form second HM features over the material layer, using the spacers as etch masks; and
etching the material layer to form patterned features in the material layer, using the spacers and the second HM features as etch masks.

14. The method of claim 13, wherein the forming of the first HM feature includes:
depositing a HM layer over the material layer;
depositing a first interlayer over the HM layer;
depositing a second interlayer over the first interlayer;
forming a photoresist feature over the second interlayer, wherein the photoresist feature includes an upper portion having the first width and a lower portion having the second width;
using the upper portion of the photoresist feature to pattern the second interlayer and the lower portion of the photoresist feature to pattern the first interlayer; and
transferring patterned first interlayer to the HM layer as the lower portion of the first HM feature and transferring patterned second interlayer to the HM layer as the upper portion of the first HM feature.

15. The method of claim 13, wherein the first portions of the first HM feature are removed by a selective etch, which does not substantially etch the spacers and the material layer.

16. The method of claim 13, wherein:
the second HM features are formed with substantially vertical profiles and have a width which is substantially same as a width of the spacers; and
the patterned features are formed with a width which is substantially same as the width of the spacers.

17. A method for fabricating a semiconductor device, the method comprising:
forming a material layer over a substrate;
forming a hard mask (HM) layer over the material layer;
forming a first photoresist (PR) layer over the HM layer;
forming a second PR layer over the first PR layer;
forming a first PR feature in the first PR layer and a second PR feature in the second PR layer by performing a single exposure process, wherein the first PR feature aligns to the second PR feature center to center, wherein a width of the second PR feature is smaller than a width of the first PR feature;
etching the HM layer to form a first HM feature, which includes transferring the second PR feature to an upper portion of the first HM feature and the first PR feature to a lower portion of the first HM feature;
forming spacers along the first HM feature, wherein first portions of the first HM feature are exposed;
removing the first portions of the first HM feature to form a second HM feature over the material layer; and
etching the material layer to form patterned features over the substrate, using the second HM feature and the spacers as etch masks.

18. The method of claim 17, wherein the first portions of the first HM feature are removed by a selective etch, which does not substantially etch the spacers and the material layer.

19. The method of claim 17, further comprising:
depositing a first interlayer over the HM layer; and
depositing a second interlayer over the first interlayer, wherein the first PR layer is formed over the second interlayer;
wherein the transferring of the second PR feature to the upper portion of the first HM feature includes transferring the second PR feature to the second interlayer; and
wherein the transferring of the first PR feature to the lower portion of the first HM feature includes transferring the first PR feature to the first interlayer.

* * * * *